(12) United States Patent
Cox et al.

(10) Patent No.: US 8,339,122 B2
(45) Date of Patent: Dec. 25, 2012

(54) SPEED SENSOR FOR A ROTATING MEMBER

(75) Inventors: Calvin Cox, West Yorkshire (GB);
Thomas W. Bach, Brighton (GB)

(73) Assignee: Cummins Turbo Technologies Limited,
Huddersfield (GB)

(*) Notice: Subject to any disclaimer, the term of this patent is extended or adjusted under 35 U.S.C. 154(b) by 0 days.

(21) Appl. No.: 12/618,963

(22) Filed: Nov. 16, 2009

(65) Prior Publication Data

US 2010/0148760 A1 Jun. 17, 2010

Related U.S. Application Data

(63) Continuation of application No. PCT/GB2008/001674, filed on May 15, 2008.

(30) Foreign Application Priority Data

May 15, 2007 (GB) .................................. 0709397.4

(51) Int. Cl.
*G01P 3/48* (2006.01)
(52) U.S. Cl. ........................................ 324/166; 324/160
(58) Field of Classification Search .................. 324/166, 324/160, 658, 661, 686
See application file for complete search history.

(56) References Cited

U.S. PATENT DOCUMENTS

| | | | |
|---|---|---|---|
| 4,329,644 A * | 5/1982 | Libertini et al. | 324/160 |
| 4,482,859 A | 11/1984 | Fournier | |
| 5,140,494 A | 8/1992 | Slade | |
| 5,497,101 A | 3/1996 | Fillion | |
| 5,959,456 A | 9/1999 | Whorlow | |
| 2009/0060716 A1 | 3/2009 | Ante et al. | |

FOREIGN PATENT DOCUMENTS

| | | |
|---|---|---|
| CN | 85202918 | 7/1986 |
| DE | G 8613968.1 | 1/1987 |
| DE | 3643095 A1 * | 7/1988 |

(Continued)

OTHER PUBLICATIONS

International Search Report and Written Opinion, PCT/GB2008/001674, Apr. 5, 2009.

*Primary Examiner* — Jay Patidar
(74) *Attorney, Agent, or Firm* — Krieg DeVault LLP

(57) ABSTRACT

A speed sensor for use in measuring the speed of rotation of a rotationally salient rotating member The speed sensor comprises an electrode and a sensor circuit. The sensor circuit comprises a constant voltage source for supplying a voltage to the electrode to generate an electric field in a dielectric medium. A current detector detects current flow between the constant voltage source and the electrode due to perturbation of the electric field by passage of at least one salient feature of the rotating member through the electric field as the rotating member rotates. The current detector outputs a first signal modulated at a frequency corresponding to the frequency of perturbation of the electric field. The first signal is amplified to produce an amplified signal modulated at a frequency corresponding to the frequency of perturbation of the electric field. The electrode voltage, the amplifier gain and the electrode position relative to the rotating member are selected such that modulation of the second signal is predominantly caused by perturbation of the electric field within the dielectric medium by the creation and/or movement of ions within the field.

17 Claims, 11 Drawing Sheets

FOREIGN PATENT DOCUMENTS

| | | |
|---|---|---|
| FR | 2568004 | 1/1986 |
| GB | 2071852 | 9/1981 |
| GB | 2 143 037 | 1/1985 |
| GB | 2 295 016 | 5/1996 |
| GB | 2 312 514 | 10/1997 |
| GB | 2314632 | 1/1998 |
| GB | 2 340 248 | 2/2000 |
| JP | 60 210767 | 10/1985 |
| WO | WO 2007/085535 | 8/2007 |

* cited by examiner

SPEED SENSOR FOR A ROTATING MEMBER

CROSS REFERENCE TO RELATED APPLICATIONS

The present application is a continuation of PCT/GB2008/001674 filed on May 15, 2008, which claims priority to United Kingdom Application No. 0709397.4 filed May 15, 2007, each of which is incorporated herein by reference.

This application claims priority from United Kingdom application number 0709397 the entire contents of which are hereby incorporated by reference.

The present invention relates to a sensor. Particularly, but not exclusively, the present invention relates to a speed sensor for turbomachinery, such as, for example, a turbocharger.

Turbochargers are well known devices for supplying air to the intake of an internal combustion engine at pressures above atmospheric (boost) pressure. A conventional turbocharger essentially comprises an exhaust gas driven turbine wheel mounted on a rotatable shaft within a turbine housing. Rotation of the turbine wheel rotates a compressor wheel mounted on the other end of the shaft within a compressor housing. The compressor wheel delivers compressed air to the intake manifold of the engine, thereby increasing engine power.

It is known to provide a turbomachine with a sensor to measure operating characteristics of the turbomachine. Any such operational information can be used as one parameter of a turbomachine control system. For example, the distance between members of the turbomachine.

One type of sensor that has been used as a turbomachine sensor is a capacitive sensor comprising a resonant circuit including a capacitor formed between a sensor electrode mounted in a bore provided in a wall of the turbine housing and the electrically conductive turbine wheel. As the turbine wheel rotates, the capacitance fluctuates dependant on the distance between the turbine wheel and the sensor electrode as each blade sweeps past the electrode. The separation between the sensor electrode and the turbine wheel is thus determined by detecting and amplifying frequency modulation in the resonant circuit due to the varying capacitance.

Within known capacitive sensors the separation between the electrode and other turbomachine component, which forms the capacitor, must be kept to a minimum, as capacitance changes sharply with increasing separation, as a function of the inverse of the separation distance. However a minimum separation is normally required for reasons of mechanical construction, tolerancing and allowance for thermal expansion. As such, signal levels are often very low. In engine environments there is generally a considerable level of electrical noise, compared with a testing laboratory which would generally have far lower noise levels. This low signal level and the electrical noise in the working environment results in a low signal to noise ratio and therefore it is often difficult to amplify the desired signal to the required levels whilst also rejecting the noise from the signal. Capacitive sensors are also problematic in that their operation can be adversely affected by the presence of contaminants in the gas passing through the turbocharger, as well as the presence of contaminant deposits on the sensor electrode itself.

The measurement of other turbomachine operating characteristics may prove of use. For instance, by providing information concerning the speed of a turbocharger to an engine control unit (ECU) it may be possible to prevent or counteract any turbocharger over speeding.

It is an object of the present invention to obviate or mitigate the above disadvantages.

According to a first aspect of the present invention there is provided a speed sensor for use in measuring the speed of rotation of a rotationally salient rotating member, the speed sensor comprising an electrode and a sensor circuit;
the sensor circuit comprising:
constant voltage source for supplying a voltage to the electrode to generate an electric field in a dielectric medium;
a current detector for detecting current flow between the constant voltage source and the electrode due to perturbation of the electric field by passage of at least one salient feature of the rotating member through the electric field as the rotating member rotates, the current detector outputting a first signal modulated at a frequency corresponding to the frequency of perturbation of the electric field; and
an amplifier circuit comprising a signal amplifier for amplifying the first signal and outputting a second signal modulated at a frequency corresponding to the frequency of perturbation of the electric field;
wherein the electrode voltage, the amplifier gain and the electrode position relative to the rotating member are selected such that modulation of the second signal is predominantly caused by perturbation of the electric field within the dielectric medium by the creation and/or movement of ions within the field.

It will be appreciated that the constant voltage source is only required to operate at a constant voltage for a period of time sufficient for the sensor to detect the rotational speed of the rotating member. The constant voltage source may for instance be capable of outputting a range of voltages, which may change over a period of time.

In addition it will be appreciated that whilst the voltage source tries to maintain a constant voltage, the voltage at the electrode may in fact fluctuate due to a lag between perturbation of the electric field and the response of the voltage source. The term "constant" should be interpreted accordingly as any such fluctuation may be disregarded.

It will be understood that a salient feature of the rotating member is any feature that causes said perturbation in the electric field as it passes therethrough. A salient feature may for instance be a feature of the three dimensional configuration of the rotating member or a localised change in a property of the material of the rotating member (including a localised change of material) or a combination of these.

The dielectric medium may for instance comprise a liquid or gas (e.g. air) between the electrode and the rotating member, or a non-conductive solid (e.g. an electrically insulating plastics material), or a combination of two or more of these.

The sensor circuit may comprise a frequency divider for receiving the second signal and outputting a third signal.

The sensor circuit may comprise a frequency counter for receiving the second or third signals and supplying a third signal indicative of the frequency of said perturbation. The sensor circuit may include an output terminal or cable for connection to a controller or other means for determining the rotational speed of said rotating member from said second, third or fourth output signals.

The sensor circuit may comprise means for determining the rotational speed of said rotating member from said first, second, third or fourth output signals.

The voltage source may supply a voltage greater than about +/−30, for instance in the range of +/−30V to +/−500V or higher. In some embodiments of the invention voltages as high as +/−1 kV or more may be appropriate. In other embodiments a voltage in the range of +/−30V to +/−150V may be appropriate. One preferred voltage range is +/−50V to +/−150V, e.g. of the order of 120V.

For instance, a raised sensor voltage relative to a relevant ground permits the described perturbation be detected, and offers improved signal to noise ratios. It has been discovered that voltages well in excess of the typical voltages used in typical electronics circuitry (i.e. 5V or 12V) causes effects in the movement of charge which are consistent with each revolution or the rotating member, whereas lower voltages allow the electrode potential to fluctuate in response to contaminants in a proximate fluid flow, or any variation in potential of any relevant proximal ground due to poor electrical connections (such as due to a shaft or wheel being connected to earth through an oil film bearing).

At least a portion of the speed sensor may be electrically shielded by at least one conductive shield. For instance a connection between the electrode and the sensor circuit (which may be remote from the electrode) or between elements of the sensor circuit (which may be remote from one another) may be shielded.

The shield may be held at a controlled electric potential.

The amplifier circuit may include a shield amplifier the output of which drives the or each conductive shield.

The speed sensor may comprising at least two conductive shields shielding respective portions of the circuit.

The or each shield amplifier may hold each conductive shield at the same electric potential. The or each shield amplifier preferably has unity gain.

The or each shield amplifier may be coupled to the signal amplifier.

A feed back loop may be connected across the amplifier and including a first capacitor. In one embodiment a shield amplifier is connected in series with the signal amplifier, and a feed back loop is connected across the signal amplifier and said shield amplifier, the feedback loop including a first capacitor. The first capacitor may be part of capacitive divider which is adapted to reduce the effective capacitance of the capacitor. The capacitive divider may comprise said first capacitor and a potential divider.

The gain of the amplifier circuit may be controlled by a capacitor with a value less than 100 pF, more preferably less than 10 pF, more preferably less than 1 pF, more preferably less than 0.1 pF, or more preferably still less than 0.01 pF. This capacitor may be in a capacitance divider as for instance mentioned above to provide a further reduced effective capacitance which is preferably less than 10 pF, more preferably less than 1 pF, more preferably less than 0.1 pF, more preferably less than 0.01 pF, and most preferably less than 0.001 pF.

In preferred embodiments the first output signal is a modulated voltage.

The current detector may comprise a capacitor and a resistor connected in series across the voltage source, wherein the electrode is connected to a node between the voltage source and a first terminal of the capacitor, and the first output signal is taken from a node between a second terminal of the capacitor and the resistor.

The electrode may have a surface from which the electric field extends, at least a portion of that surface which in use will be closest to the rotating member being covered by body of protective material. The protective material may for instance be non-conductive.

The electrode may comprise an electrode body and an electrode surface from which the electric field extends, at least a portion of that surface which in use will be closest to the rotating member being defined by a conductive material different from the body of the electrode.

According to a second aspect of the present invention there is provided a rotating machine comprising:

a rotationally salient rotating member supported for rotation about an axis and a speed sensor for sensing the rotational speed of the rotating member, the speed sensor comprising:

an electrode fixed in position relative to said axis;

a constant voltage source connected to the electrode for establishing an electric field between the electrode and a substantially constant potential portion of the rotating machine, wherein the electrode is positioned so that at least one salient feature of the rotating member passes through the electric field as the rotating member rotates about said axis, thereby perturbing the electric field on each revolution of the rotating member;

a current detector for detecting current flow between the voltage source and the electrode in response to said perturbation of the electric field; and an amplifier circuit comprising a signal amplifier for amplifying the first signal and outputting a second signal modulated at a frequency corresponding to the frequency of perturbation of the electric field;

wherein the electrode voltage, the amplifier gain and the electrode position relative to the rotating member are selected such that modulation of the second signal is predominantly caused by perturbation of the electric field within the dielectric medium by the creation and/or movement of ions within the field.

The substantially constant potential portion of the rotating machine may be said rotating member.

The rotating member may for instance be non-conductive and said constant potential portion of the rotating machine may be a conductive body supported by the rotating machine in a fixed spatial relationship to the electrode so that said at least one salient feature of the rotating member passes between the electrode and the constant potential portion on each revolution of the rotating member about said axis.

The constant potential portion of the rotating machine may for instance be a conductive portion of a housing of the rotating machine. Alternatively, the rotating member may be mounted on a shaft at least a portion of which is conductive and comprises said constant potential portion of the rotating machine.

The rotating member may comprise a plurality of said salient features. Preferably a surface of said electrode though which the electric field passes has an extent in the rotational direction of the rotating member less than the separation of rotationally adjacent salient features of the rotating member.

The or each salient feature may comprises a physical protuberance and/or localised change in material properties of the rotating member.

In some embodiments the salient feature is a physical protuberance including an edge. The or each salient feature may be a protuberance extending generally radially and/or axially relative to said axis. For instance, the or each salient feature may a blade or fin.

The rotating member may rotate within a chamber defined by a housing, a fluid being present within said chamber, such that the electric field passes through said fluid between the electrode and the rotating member. The housing may have a fluid inlet and a fluid outlet, and said chamber may lie in a fluid flow path between said inlet and said outlet.

The rotating machine may be a turbomachine. For example, the rotating machine may be a turbine or a compressor (included for instance in a turbocharger or other) and said rotating member may be a turbine wheel or a compressor wheel.

The electrode may be supported by a member inserted into the inlet or outlet and electrically insulated from said member. The inserted member may be an annular member such as for instance a compressor noise baffle.

In some embodiments the electrode is supported by a housing of the rotating machine and is electrically insulated from said housing.

The electrode is preferably not exposed to said fluid. The electrode may for instance be separated from said fluid by a layer or body of material which is at least substantially non-reactive to said fluid. The electrode may be separated from said fluid by a layer or body of electrically insulating material.

Irrespective of the method of supporting the electrode, in some embodiments (such as for example where the rotating machine is a compressor) it preferably has a fixed location with respect to a housing, and a set minimum distance from the rotating member (this minimum may only be at one or more orientations of the wheel, and may be dependent upon the wheel taking up any axial play in a bearing, and any ordinary thermal and centripetal expansion). This minimum distance is preferably at least 0.1 mm, more preferably at least 0.2 mm, more preferably at least 0.3 mm, more preferably at least 0.4 mm, more preferably at least 0.6 mm, more preferably at least 0.8 mm, more preferably at least 1 mm, more preferably at least 1.5 mm, more preferably at least 2 mm, more preferably at least 5 mm, and most preferably at least 10 mm. This distance is also preferably less than three times the diameter of the rotary member, or a part thereof passing through the electric field area, and more preferably less than said diameter, and most preferably less than a third thereof. Where the rotating member has an array of blades, the distance is further preferably less than the separation of the blades in the electric field area, more preferably half thereof.

The constant potential portion of the machine may be at ground potential or a virtual ground potential.

The speed sensor may be a speed sensor according to any other aspect of the invention.

In a third aspect of the invention there is provided a method of measuring the speed of a rotating machine comprising a rotationally salient rotating member supported for rotation about an axis using a speed sensor according to any other aspect of the invention.

According to a fourth aspect of the invention there is provided a method of measuring the speed of a rotating machine comprising a rotationally salient rotating member supported for rotation about an axis, the method comprising:
  supporting an electrode in a position relative to said axis;
  supplying a constant voltage to the electrode to establish an electric field between the electrode and a substantially constant potential portion of the rotating machine;
  wherein the electrode is positioned so that at least one salient feature of the rotating member passes through the electric field as the rotating member rotates about said axis, thereby perturbing the electric field on each revolution of the rotating member;
  detecting current flow between the voltage source and the electrode in response to said perturbation of the electric field to derive a first signal modulated at the frequency of said perturbation;
  amplifying the first signal and outputting a second signal modulated at a frequency corresponding to the frequency of perturbation of the electric field;
  wherein the electrode voltage, the amplifier gain and the electrode position relative to the rotating member are selected such that modulation of the second signal is predominantly caused by perturbation of the electric field within the dielectric medium by the creation and/or movement of ions within the field; and determining the rotational speed from the modulation of said signal.

According to a fifth aspect the invention provides a speed sensor for use in measuring the speed of rotation of a rotationally salient rotating member, the speed sensor comprising an electrode and a sensor circuit;
the sensor circuit comprising:
a constant voltage source for supplying a voltage to the electrode to generate an electric field;
a current detector for detecting current flow between the constant voltage source and the electrode due to perturbation of the electric field by passage of at least one salient feature of the rotating member through the electric field as the rotating member rotates;
the current detector outputting a first output signal modulated at a frequency corresponding to the frequency of perturbation of the electric field.

The sensor circuit preferably further comprises a signal amplifier for amplifying the first output signal and outputting a second output signal.

The electrode voltage, amplifier gain and distance between the electrode and the rotating member may be selected such that pulses in the electrode current would be generated predominantly by the movement of ions passing through the localised electric field. The ions may be at least one of: within a fluid or adsorbed on a non-conducting solid.

At least a portion of the speed sensor may be electrically shielded by at least one conductive shield which may be held at a controlled electric potential. Preferably the sensor includes at least one shield amplifier the output of which drives the or each conductive shield. The or each shield amplifier may be coupled to the signal amplifier. A shield amplifier may for instance be connected in series with the signal amplifier, and the sensor circuit may include a feed back loop connected across the signal amplifier and said shield amplifier, the feedback loop including a first capacitor. The first capacitor may be part of capacitive bridge (which may comprises the first capacitor and at potential divider) which is adapted to reduce the effective capacitance of the capacitor.

According to a sixth aspect the invention provides a method of measuring the speed of a rotating machine comprising a rotationally salient rotating member supported for rotation about an axis, the method comprising:
supporting an electrode in a position relative to said axis;
supplying a constant voltage to the electrode to establish an electric field between the electrode and a substantially constant potential portion of the rotating machine;
wherein the electrode is positioned so that at least one salient feature of the rotating member passes through the electric field as the rotating member rotates about said axis, thereby perturbing the electric field on each revolution of the rotating member;
detecting current flow between the voltage source and the electrode in response to said perturbation of the electric field to derive a signal modulated at the frequency of said perturbation; and
determining the rotational speed from the modulation of said signal.

It is believed that the sensor operates by detecting perturbation in the electric field due or more of the following:
a modulation of charge distribution within the electric field due to the movement of charge generated by friction (triboelectric effect). The friction may for instance be within the fluid itself (such as turbulence) or between the fluid and a body within the fluid conduit (such as a salient feature of the rotating member);

a modulation of charge distribution within the electric field due to a variation in physical properties of the fluid caused by movement of a salient feature of the rotating member through the electric field (e.g. increased pressure leading to increased charge density);

a modulation of the electric properties of any dielectric material within which the electric field is created (e.g. pressure and/or temperature and/or humidity or other changes affecting the dielectric constant of the dielectric material).

Accordingly one aspect of the present invention is a method of measuring the rotational speed of a rotationally salient member supported for rotation about an axis, the method comprising:

supporting an electrode in a position relative to said axis;

supplying a constant voltage to the electrode to establish an electric field between the electrode and a substantially constant potential body;

wherein the electrode is positioned so that at least one salient feature of the rotating member passes through the electric field as the rotating member rotates about said axis, thereby perturbing the electric field on each revolution of the rotating member;

detecting current flow between the voltage source and the electrode in response to perturbation of the electric field to derive a signal modulated at the frequency of said perturbation; and determining the rotational speed from the modulation of said signal;

wherein said perturbation is due to one or more of the following effects:

a modulation of charge distribution within the electric field due to the movement of charge generated by friction (triboelectric effect). The friction may for instance be within the fluid itself (such as turbulence) or between the fluid and a body within the fluid conduit (such as a salient feature of the rotating member);

a modulation of charge distribution within the electric field due to a variation in physical properties of the fluid caused by movement of a salient feature of the rotating member through the electric field (e.g. increased pressure leading to increased charge density); and a modulation of the electric properties of any dielectric material within which the electric field is created (e.g. pressure and/or temperature and/or humidity or other changes affecting the dielectric constant of the dielectric material).

Similarly the present invention provides a sensor for use in measuring the rotational speed of a rotationally salient member supported for rotation about an axis, the sensor comprising an electrode and a sensor circuit;

the sensor circuit comprising:

a constant voltage source for supplying a voltage to the electrode to generate an electric field;

a current detector for detecting current flow between the constant voltage source and the electrode due to perturbation of the electric field by passage of at least one salient feature of the rotating member through the electric field as the rotating member rotates;

the current detector outputting an output signal modulated at a frequency corresponding to the frequency of perturbation of the electric field;

wherein the perturbation of the electric field is caused by one or more of the following effects:

a modulation of charge distribution within the electric field due to the movement of charge generated by friction (triboelectric effect). The friction may for instance be within the fluid itself (such as turbulence) or between the fluid and a body within the fluid conduit (such as a salient feature of the rotating member);

a modulation of charge distribution within the electric field due to a variation in physical properties of the fluid caused by movement of a salient feature of the rotating member through the electric field (e.g. increased pressure leading to increased charge density); and a modulation of the electric properties of any dielectric material within which the electric field is created (e.g. pressure and/or temperature and/or humidity or other changes affecting the dielectric constant of the dielectric material).

The sensor circuit preferably includes an amplifier the operating characteristics of which are adapted so as to amplify the output signal due to one or more of these effects whilst minimising signal noise which may otherwise impede detection of signal modulation due to said perturbation. The amplifier could for instance include a signal amplifier and shield amplifier as discussed above.

The invention also contemplates the provision of a method of measuring changes in a characteristic of a fluid, the method comprising:

supporting an electrode in a position relative to the fluid;

supplying a constant voltage to the electrode to establish an electric field between the electrode and a substantially constant potential body, the electrode being positioned so that the electric field extends into said fluid;

detecting current flow between the voltage source and the electrode in response to perturbation of the electric field due to changes in a characteristic of the fluid; and determining the change in said characteristic from the detected current flow;

wherein said perturbation is due to:

a modulation of charge distribution within the electric field due to the movement of charge caused by a change in said characteristic; and/or a modulation of the dielectric constant of said fluid due to change in said characteristic.

The characteristic may for instance be temperature, pressure, humidity or chemical composition of the fluid.

The invention also contemplates the provision of a method for measuring mass flow of fluid flowing through a conduit, the method comprising:

supporting an electrode in a first position relative to said conduit;

supplying a constant voltage to the electrode to establish an electric field between the electrode and a substantially constant potential body, the electrode being positioned so that the electric field extends into said conduit;

modifying a characteristic of the fluid at a second position upstream of the first position;

detecting current flow between the voltage source and the electrode in response to perturbation of the electric field due to said modified characteristic of the fluid; and determining the mass flow of the fluid from the separation of said first and second positions and the time lapse between said modification of the fluid characteristic and said current detection.

Other preferred and particularly advantageous features of the invention will be apparent from the following description.

Specific embodiments of the present invention will now be described, by way of example only, with reference to the accompanying drawings, in which.

Figure 5:
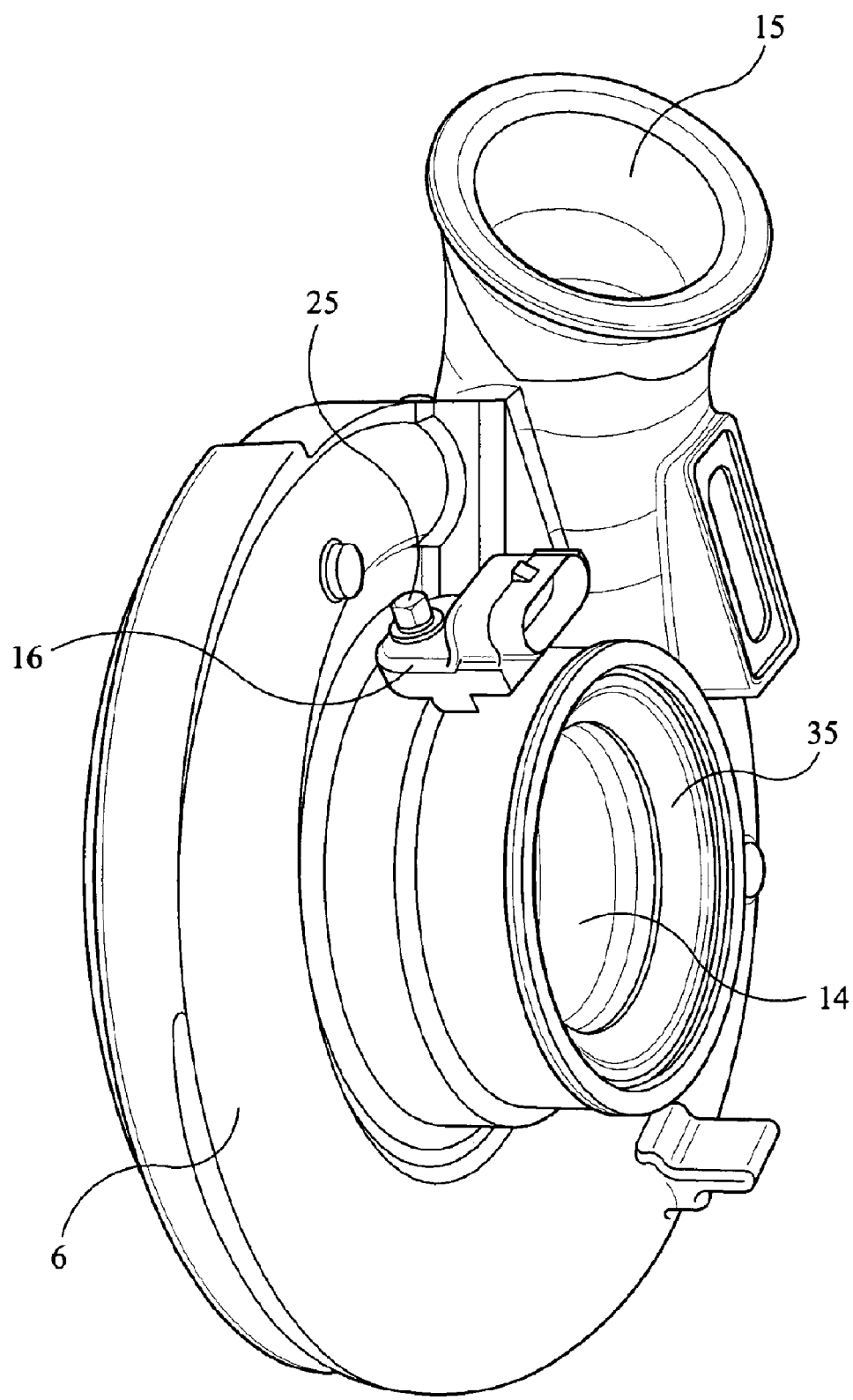
FIG. 5 is a perspective view of a turbocharger compressor housing in accordance with a second embodiment of the invention.
Figure 7:
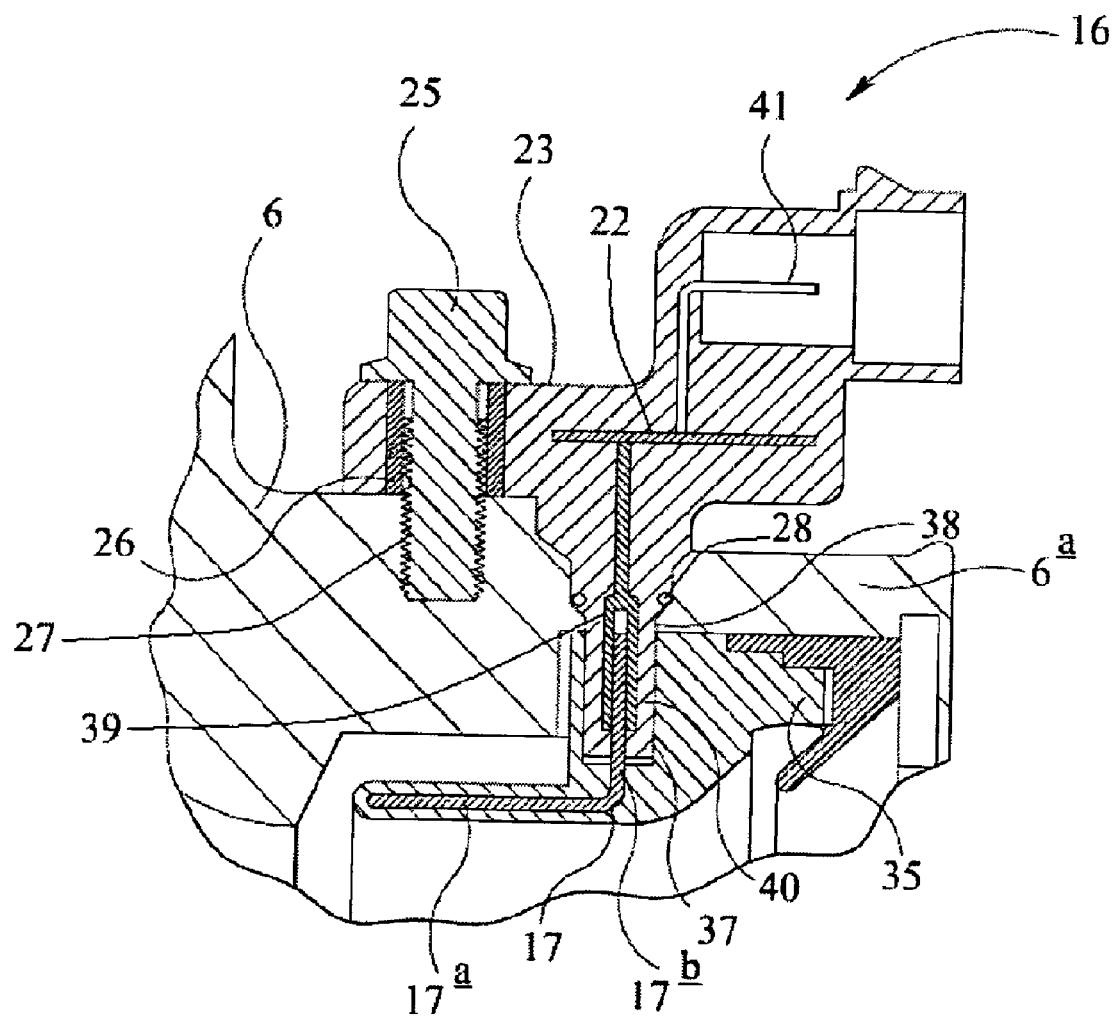
Figure 8:
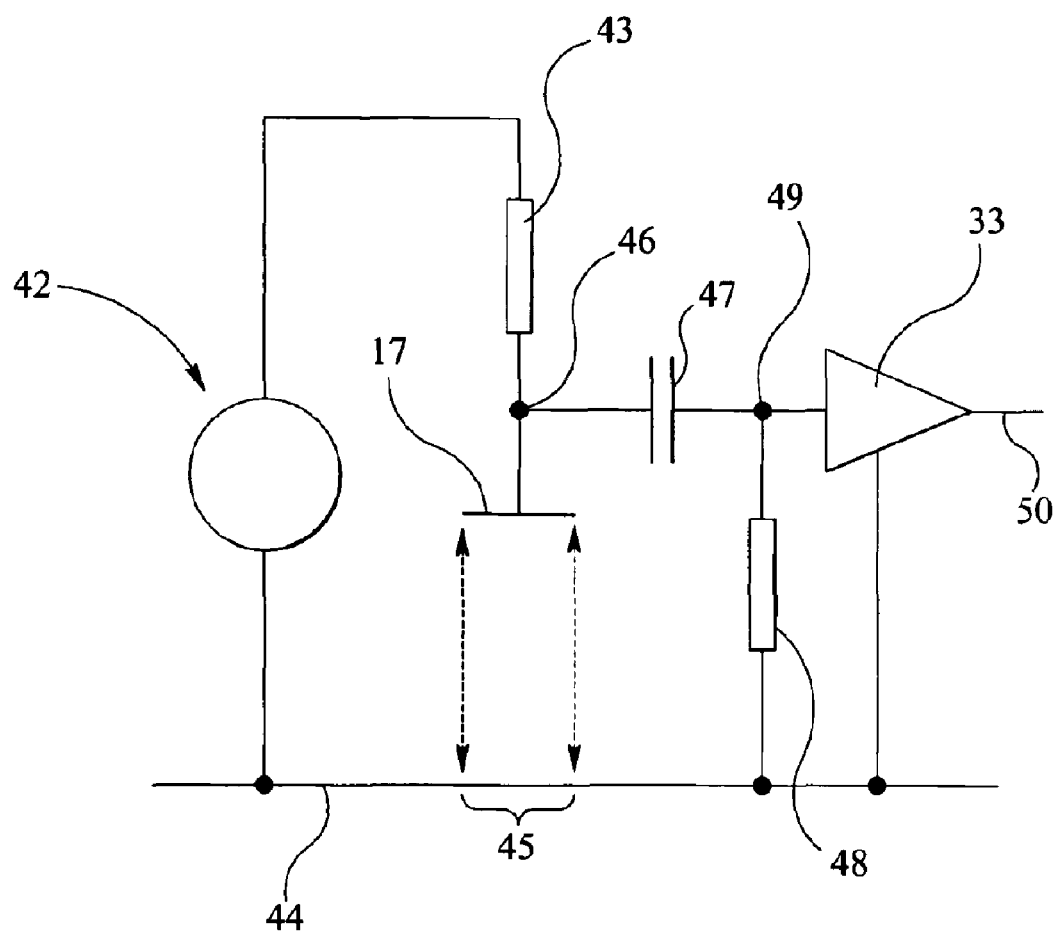
Figure 9:
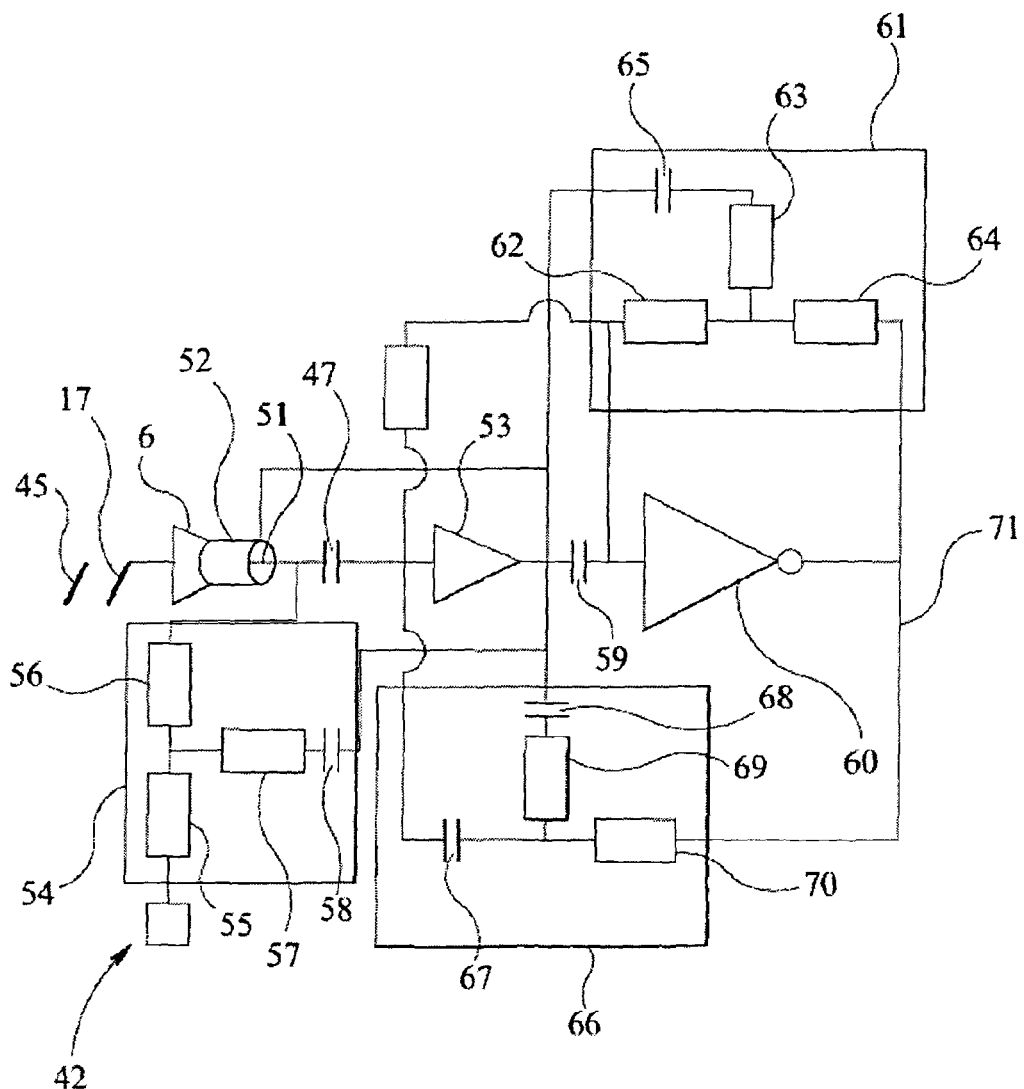
Figure 10A:
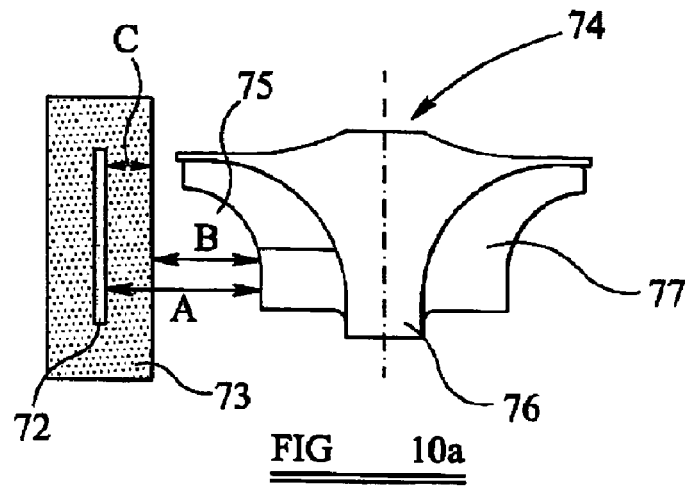
Figure 10B:
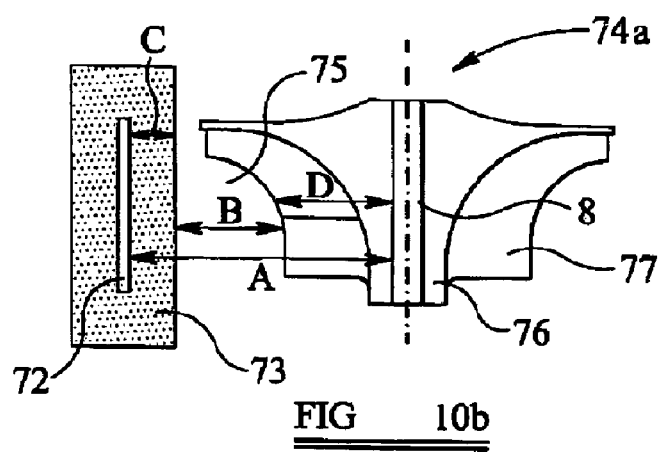
Figure 10C:
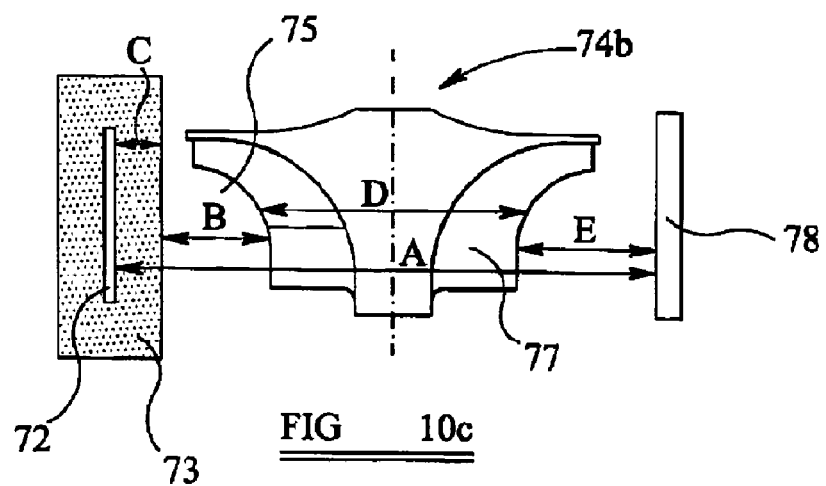
Figure 11A:
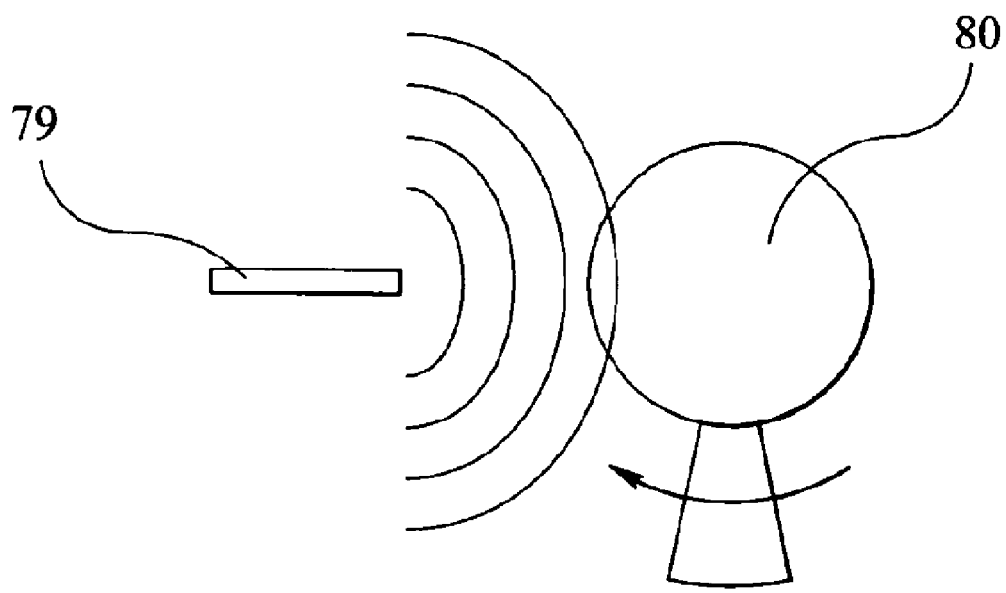
Figure 11B:
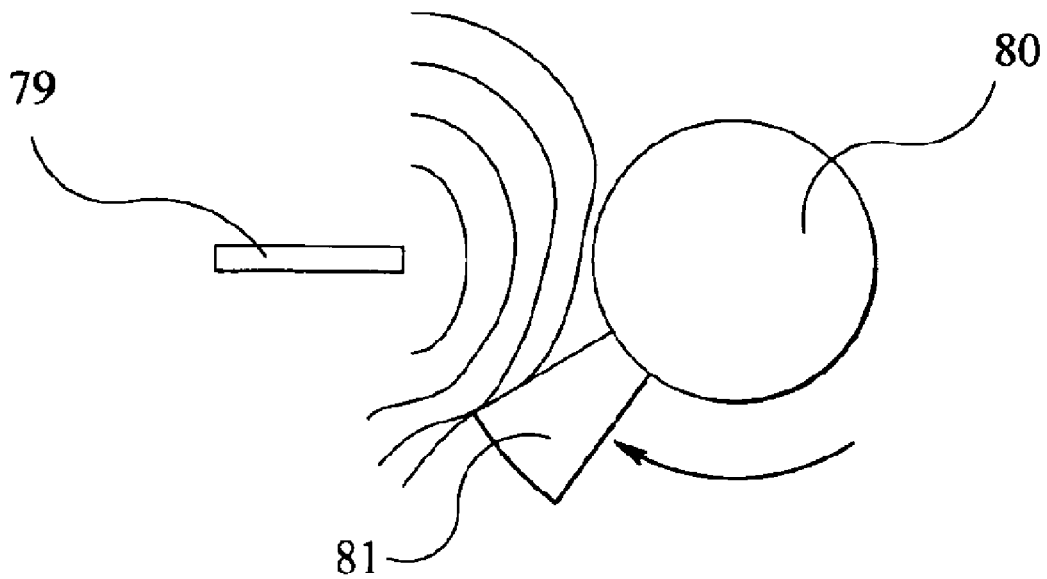

FIG. 7 cross-section through a portion of the compressor of FIG. 5;

FIG. 8 is a schematic circuit diagram of an embodiment of a sensor circuit in accordance with the present invention;

FIG. 9 is a circuit diagram of a further embodiment of a sensor circuit according to the present invention;

FIG. 10a is a simplified diagrammatic cross-section through an electrically conductive compressor wheel and adjacent electrode assembly in accordance with the present invention;

FIG. 10b is a simplified diagrammatic cross-section through an electrically non-conductive compressor wheel supported on an electrically conductive shaft and adjacent electrode assembly in accordance with the present invention;

FIG. 10c is a simplified diagrammatic cross-section through an electrically non-conductive compressor wheel and adjacent electrode assembly in accordance with the present invention; and FIGS. 11a and 11b schematically illustrate electric field lines between an electrode of a sensor according to the invention and a rotating member.

Figure 1:
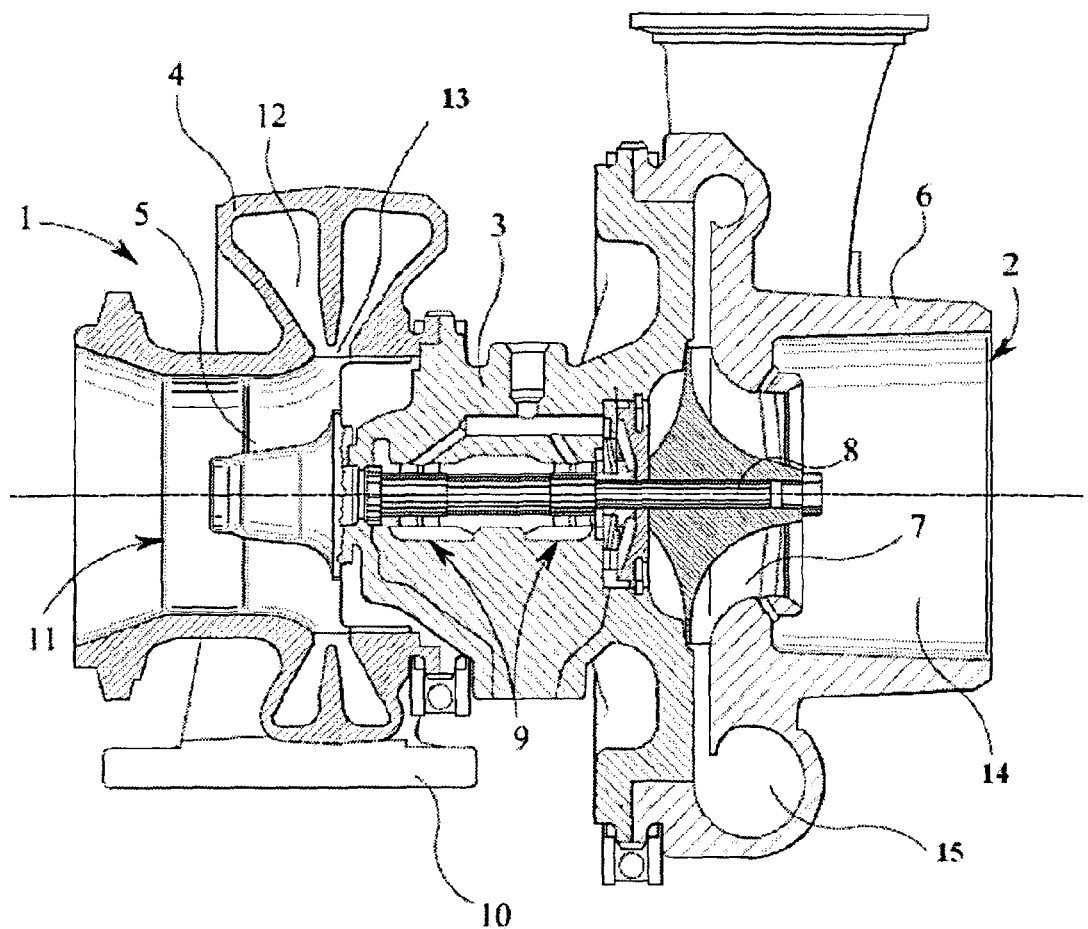
FIG. 1 is an axial cross-section through a turbocharger with a fixed geometry turbine which illustrates the basic components of a turbocharger.
Figure 2:
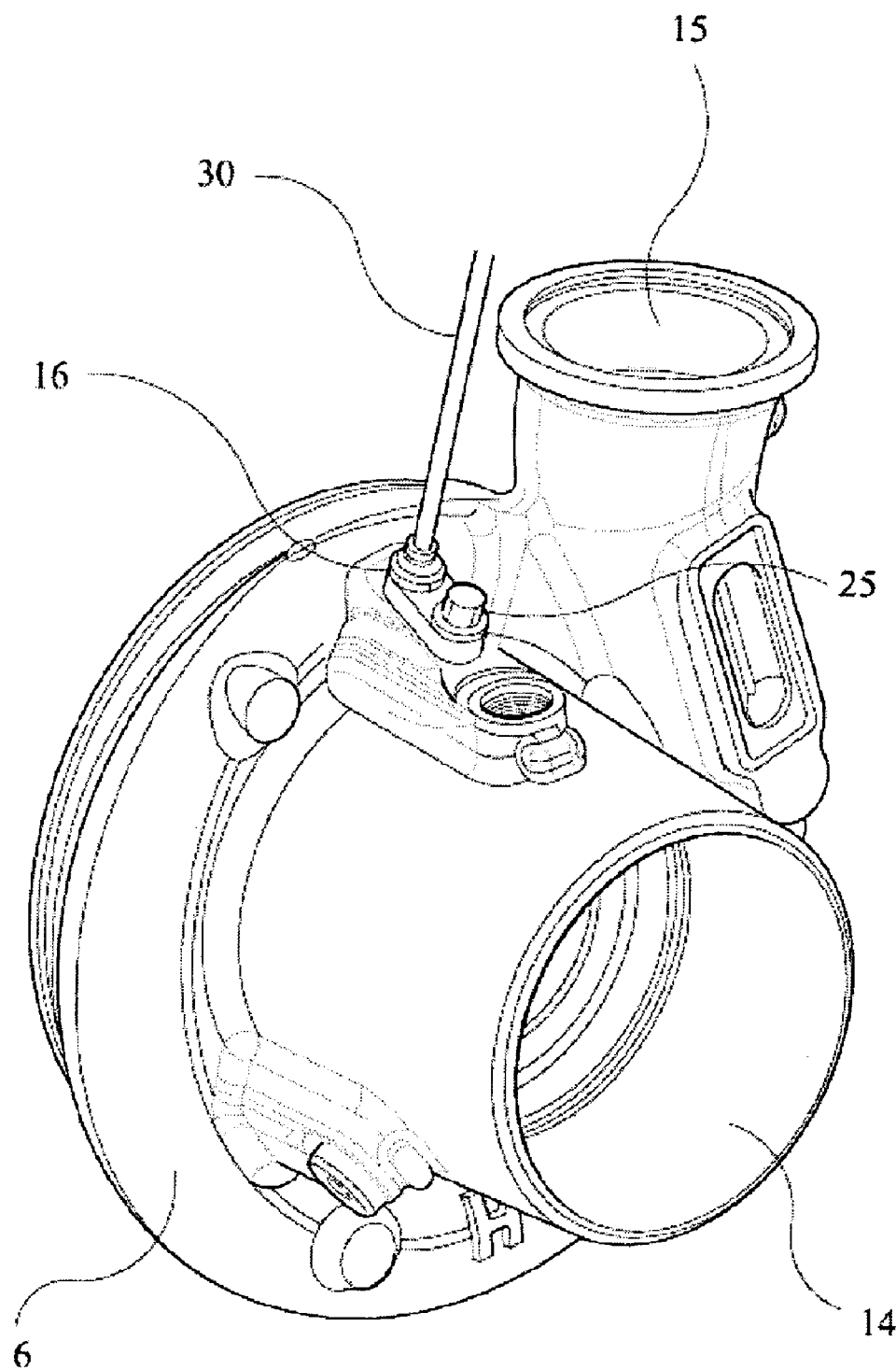
FIG. 2 is a perspective view of a turbocharger compressor housing in accordance with a first embodiment of the invention.
Figure 3:
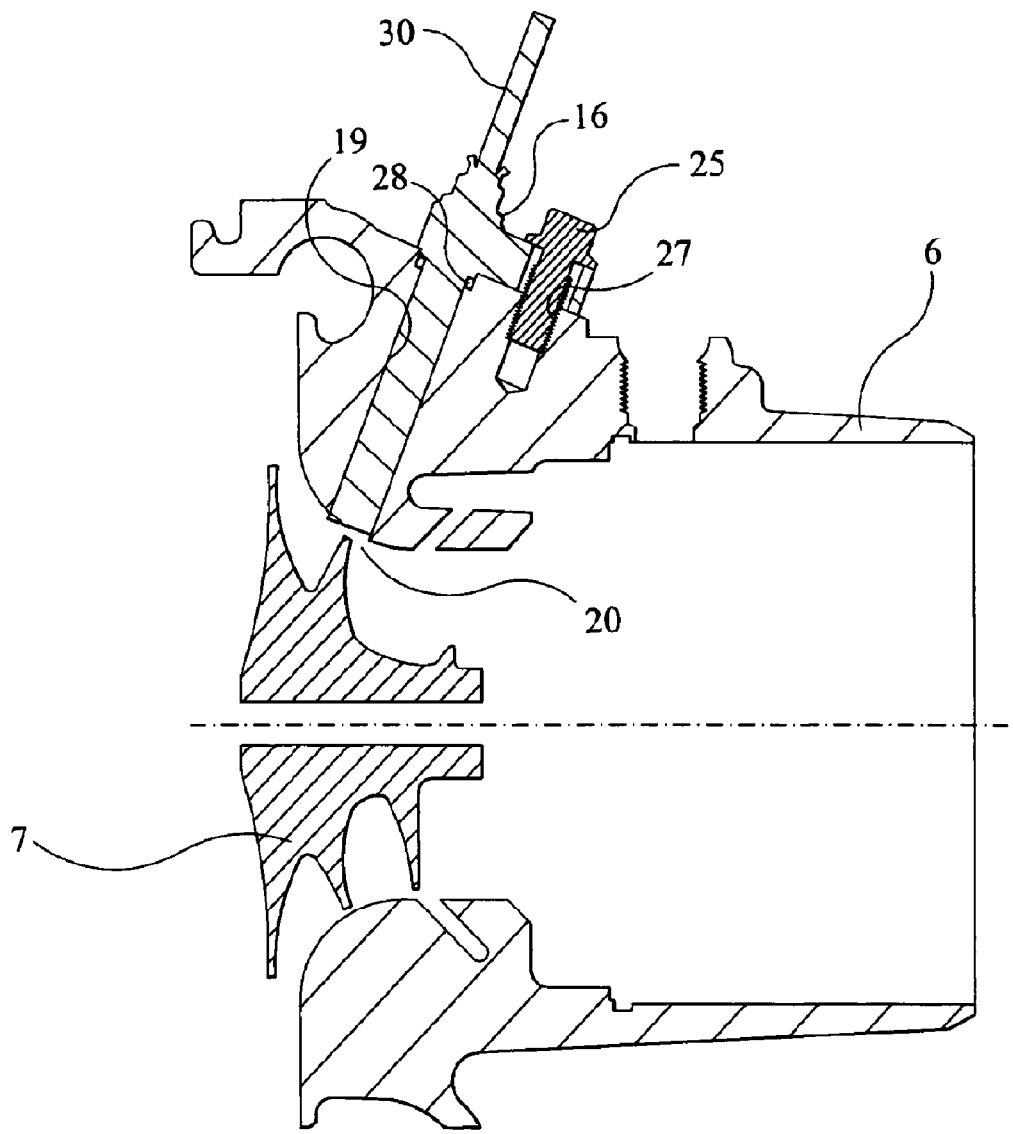
FIG. 3 is a cross-section through a portion of the compressor of FIG. 2.

Referring first to FIG. 1, this is an axial cross-section through a typical turbocharger with a fixed geometry turbine which illustrates the basic components of a turbocharger. The turbocharger comprises a turbine 1 joined to a compressor 2 via a central bearing housing 3. The turbine 1 comprises a turbine housing 4 which houses a turbine wheel 5. Similarly, the compressor 2 comprises a compressor housing 6 which houses a compressor wheel 7. The turbine wheel 5 and compressor wheel 7 are mounted on opposite ends of a common turbo shaft 8 which is supported on bearing assemblies 9 within the bearing housing 3.

The turbine housing 4 is provided with an exhaust gas inlet 10 and an exhaust gas outlet 11. The inlet 10 directs incoming exhaust gas to an annular inlet chamber, i.e. volute 12, surrounding the turbine wheel 5 and communicating therewith via a radially extending annular inlet passageway 13. Rotation of the turbine wheel 5 rotates the compressor wheel 7 which draws in air through an axial inlet 14, defined in part by an annular inlet wall 6a, and delivers compressed air to the engine intake (not shown) via an outlet 15.

FIGS. 2 to 4a illustrate a turbocharger compressor including a turbocharger speed sensor in accordance with a first embodiment of the invention. Although features of the compressor housing 6 differ in detail from those of the turbocharger compressor of FIG. 1, the construction is generally the same and where appropriate the same reference numbers are used to identify corresponding features. A speed sensor assembly 16 according to the invention is fitted to the compressor housing 6. The sensor assembly 16 (shown in isolation in FIG. 4) comprises an elongate electrode 17 supported within an electrically conductive guard tube 18 which extends through a generally radial bore 19 provided through the compressor housing wall. The bore 19 opens at an internal surface 20 of the compressor which is swept by the blades of the compressor wheel 7 so that an enlarged end 21 of the electrode 17 is located in close proximity to the compressor wheel 7. The opposite end of the electrode 17, and the guard tube 18, are connected to a PCB 22 which is housed within an electrically insulating sensor casing 23, which includes a tubular portion 24 which sheaths the guard tube 18. The sensor assembly 16 is secured to the housing 6 by a bolt 25 which passes through an aperture 26 in the sensor casing 23 and into a threaded bore 27 in the housing wall. An o-ring seal 28 is provided to seal sensor within the bore 19. An additional threaded bore 28a is also provided so as to facilitate the location of an inlet sensor device, such as a temperature sensor, (not shown).

Figure 4:
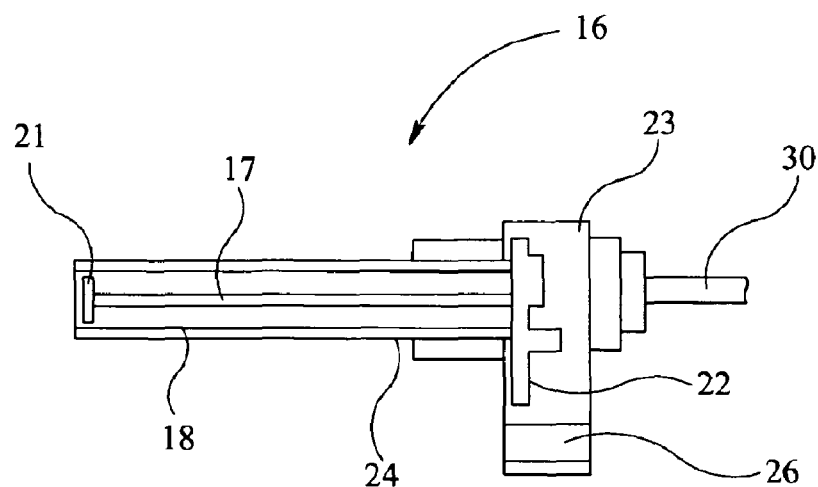
FIG. 4 shows a longitudinal cross-section through a sensor electrode assembly of the compressor of FIGS. 2 and 3.
Figure 4A:
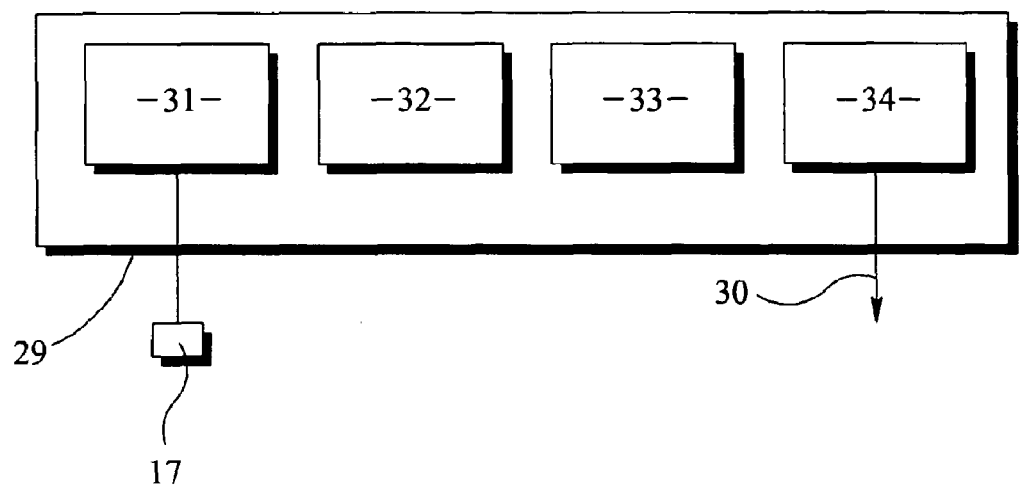
FIG. 4a shows schematic features of a sensor circuit in accordance with the invention.

The PCB 22 electrically connects the electrode 17 and the guard tube 18 to a sensor circuit 29 located on the PCB 22 (shown schematically in FIG. 4a). The sensor circuit 29 comprises a fixed voltage source 31, a current detection circuit 32, an amplifier 33 and a frequency counter 34. The frequency counter may comprise a frequency divider (not shown). The frequency counter outputs a signal representative of the rotational speed of the compressor wheel which may be for instance be supplied, via connecting cable 30, to an engine ECU or other controller. Further details, and operation, of exemplary embodiments of the sensor circuit are described later.

Figure 6:
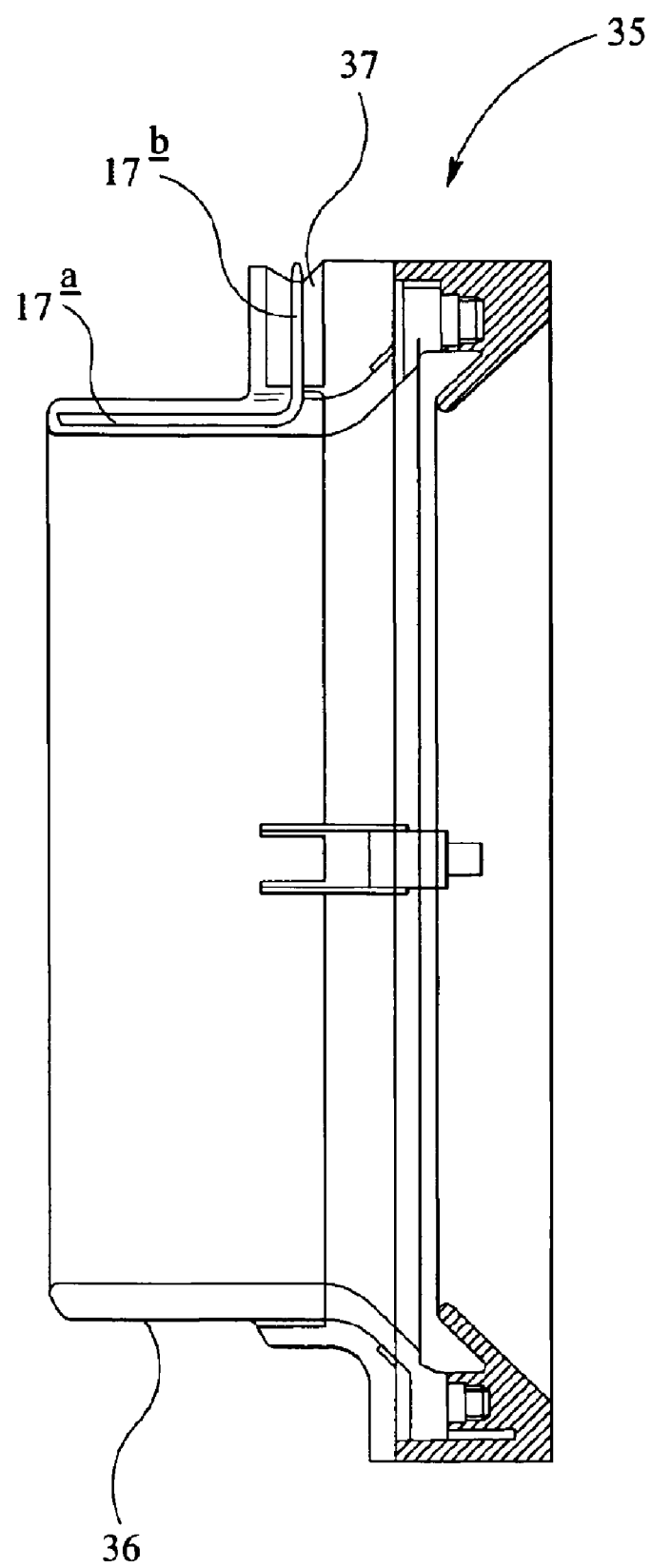
FIG. 6 is a cross-sectional view of a noise baffle insert of the turbocharger compressor of FIG. 5.

A second embodiment of a turbocharger speed sensor according to the present invention is illustrated in FIGS. 5 to 7. Again, although features of the compressor housing differ in detail from those of the turbocharger compressor of FIGS. 1 and 2 to 4, where appropriate the same reference numbers are used to identify corresponding features. Referring first to FIG. 5, the compressor includes a noise baffle 35 in the form plastic insert which is installed in the compressor inlet 14. Provision of a compressor noise baffle as an insert separate to the compressor housing is known in the art and the function of the noise baffle will not be described in detail. However, as can be seen in FIG. 6 the noise baffle 35 is an annular structure which includes a tubular portion 36.

In accordance with the present invention the compressor includes a sensor assembly 16 which includes an electrode 17 which is embedded in the plastic noise baffle insert 35 as shown in FIGS. 6 and 7. The electrode 17 is generally L-shaped having an axially extending portion 17a and a radially extending portion 17b which projects into a bore 37 provided in the baffle insert 35 for connection to other components of the sensor assembly 16 as illustrated in FIG. 7.

Referring to FIG. 7, the compressor housing 6 is provided with a radial connector aperture 38 in the inlet wall 6a which aligns with the bore 37 of the baffle insert 35 to facilitate electrical connection to the radial portion 17b of the electrode 17. The tubular portion 36 of the insert 35 extends towards the compressor wheel (not shown) so that the end of the axial portion 17a of the electrode 17 lies in close proximity to the compressor wheel.

The sensor assembly 16 further comprises a electrically insulating sensor casing 23 which houses a PCB 22 connected to an electrically conductive socket 39. The socket 39 is located in a tubular portion 40 of the casing 23 which is inserted into the baffle bore so that the radial portion b of the electrode porting extends into the socket 31. The tubular portion 40 may be an interference fit in the bore 37 and the electrode portion 17b may be an interference fit in the socket 39. The end of the electrode portion 17b is tapered to aid the insertion into the socket 39. An O-ring seal 28 seals the sensor casing 23 with respect to the aperture 38. The sensor assembly 16 is secured to the housing 6 by a bolt 25 which extends through an aperture 26 in the casing 23 and into a threaded bore 27 in the housing wall 69.

The PCB 22 connects the electrode 17 (via the sensor circuit 29 situated on the PCB 22) to an output pin 41 which is provided for connection to an engine ECU or other controller. The sensor circuit is not shown, but is the same as the sensor circuit 29 illustrated schematically in FIG. 4a.

Embedding the electrode 17 within a removable insert 35 ensures that integrating the sensor into the turbocharger is simple and can be done at very low cost. The electrode 17 may for instance be a simple conductive (e.g. copper) wire. Preferably it is of a durable metal. Different compressor inlet configurations can be readily be accommodated by appropriately configuring the baffle insert 35, without the need to change other details of the sensor assembly 16 or compressor housing 6. The electrode can also be replaced if necessary simply by replacing the removable baffle insert 35.

Both above embodiments of the invention have the same sensor circuit 29 and operate in the same way. This will now be described.

A voltage V is applied between ground and the electrode 17 by the constant voltage source 42. This establishes an electric field between the electrode 17 and the compressor wheel 7 which is a virtual ground. As the compressor wheel 7 rotates, the wheel blades successively sweep past the location of the electrode 17. The electric field between the electrode and the compressor wheel is perturbed as each blade sweeps through the electric field. Current flows between the voltage source and the electrode in response to the perturbation of the electric field as the voltage source seeks to maintain voltage V at the electrode. The current flow is thus modulated with a frequency directly dependant on the speed of rotation of the compressor wheel. The detected current is amplified by amplifier 33 and the amplified signal is fed to the frequency counter 34 which outputs a signal representative of the instantaneous compressor wheel (i.e. turbocharger) speed.

Exemplary embodiments of the sensor circuit will now be described with reference to FIGS. 8 and 9.

Referring first to FIG. 8, this shows a schematic circuit illustrating the operation principles of a portion of the sensor circuit 29. A DC power supply 42 is electrically connected via a resistor 43 to the electrode 17. The power supply 42 is also electrically connected to a common ground 44. The common ground 44 may be a conductive component or may be bodywork or chassis of a vehicle in which the turbocharger is located, or may be earth (particular in the case of a turbocharger fitted to a stationary engine such as a power generator). The compressor wheel is also at the common ground potential indicated by 45. This establishes an electric field between the electrode and the compressor wheel. As discussed above, a modulated current will flow between the voltage source and the electrode as the compressor wheel rotates. This current will cause the voltage at a junction 46 intermediate the electrode 17 and resistor 43 to change. The junction 46 is electrically connected to the common ground 44 via a capacitor 47 and resistor 48. The change in voltage at junction 46 will cause a current to flow through the coupling capacitor 47, which will result in a modulation of the voltage at a second junction 49 intermediate the capacitor 47 and the resistor 48. The modulation of voltage at junction 49 is amplified by the connected amplifier 33, the output 50 of which is then supplied to the frequency counter 34. The frequency counter (not shown in FIG. 8) may be entirely conventional.

FIG. 9 illustrates a second embodiment of a portion of the sensor circuit 29. Due to the fact that the electrode 17 and its electrical connection to the sensor circuit is very sensitive to adverse electric fields external to the turbocharger, for example radio interference, the electrode 17 and the electrical connection between the electrode and the sensor circuit 29 is screened. In the case of the electrode of the above described embodiments of the invention, the adverse external electric field screening is conveniently provided by the metal compressor housing 6, and in the case of the embodiment of FIGS. 2 to 4 screening is also provided by the guard tube 18. As such, if the electrode 17 is to be located remotely to at least part the detection circuitry (especially the amplifier), it is important that screened cable, such as co-axial cable, is used to connect the electrode 17 to the detection circuitry. The inner core 51 of the screened cable carries the signal from the electrode 17, and is surrounded by an outer shield layer 52. The co-axial cable acts as a capacitor. Extraneous capacitance in the cable is compensated for by a guard amplifier 53. The guard amplifier is held at a controlled potential, for example, but not limited to, the virtual ground potential.

As with the previous circuitry embodiment, a DC power supply 42 is electrically connected to the electrode 17. Intermediate the power supply 42 and electrode 17 is a bias circuit 54 comprising resistors 55, 56 and 57 and capacitor 58. The purpose of the bias circuit is to increase the output signal to noise ratio. The capacitor 58 of the bias circuit 54 is electrically linked to the output of the guard amplifier 53 such that the bias circuit 54 provides a larger impedance to the electrode 17. The function of the capacitor 47 in this embodiment is very similar to that of the like numbered capacitor in the previous embodiment, in that it connects the electrode 17 to the input of the guard amplifier 53. The guard amplifier 53 functions so as to nullify any difference in potential between an amplifier ground and a compressor wheel ground. Unlike in the first circuitry embodiment, the compressor wheel ground and amplifier may not be connected to a common ground. Any difference between the amplifier ground and compressor wheel ground will result in inaccurate measurements. The output of the guard amplifier 53 feeds the outer shield layer 52 of the co-axial cable. This maintains a constant voltage at the amplifier, such that only changes in the electrode 17 signal are amplified. In this way, unwanted signal content, i.e. noise is removed.

The output from the guard amplifier 53 is fed via an intermediate capacitor 59 to the input of an inverting amplifier 60. A capacitive divider 61, comprising resistors 62, 63 and 64 and capacitor 65, is electrically connected around the amplifier 60 and acts as a feedback element which biases the amplifier 60. In addition, the capacitive divider 61, in combination with the capacitor 59, constitutes a high pass filter. The resistor 62 has a very high effective resistance so that the high pass filter has a low cut-off frequency so that the sensor has an overall bandwidth that starts at a low frequency. A low pass filter (not shown) may also be used to remove high frequency components of the signal which are not related to the motion of the compressor wheel.

The use of two amplifiers in series, in this case the guard amplifier 53 and inverting amplifier 60 is advantageous in that it offers a cost saving over the use of just one high quality amplifier which may be capable of performing a similar function.

A further capacitive divider 66, comprising capacitors 67 and 68 and resistors 69 and 70, is electrically linked between the input of the guard amplifier 53 and the output of the inverting amplifier 60. The capacitive divider 66 acts as a feedback element around both amplifiers 53, 60. The capacitive divider 66 provides an effective small feedback capacitor 67, due to the potential divider action of resistors 69 and 70, resistor 69 being indirectly electrically linked and referenced to the guard amplifier 53 output. The circuit output can be taken at point 71, from which it may then be supplied to the frequency counter (not shown) if necessary after further amplification.

The gain of the amplifiers 53, 60 is controlled by the capacitive divider 66. The capacitive divider preferably provides an effective capacitance around the amplifiers 53, 60 which is preferably less than 10 pF, more preferably less than 1 pF, more preferably less than 0.1 pF, more preferably less than 0.01 pF, and further preferably still less than 0.001 pF. Alternatively, the capacitive divider 66 may be replaced by a single capacitor connected around the amplifiers 53, 60. In this case the capacitor preferably has a value less than 100 pF, more preferably less than 10 pF, more preferably less than 1 pF, more preferably less than 0.1 pF, and further preferably still less than 0.01 pF.

The use of a capacitive divider 66 (or equivalent capacitor) with a value in the range discussed above controls the gain of the amplifiers 53, 60 such that a utilised electrode 17 can have a smaller effective area and/or be placed a greater distance away from the compressor wheel, and detect a perturbation of the electric field which would not be detected by a similar sensor with larger conventional capacitors. This is particularly advantageous if the sensor is utilised to measure the speed of a large compressor, where factors such as axial movement and thermal expansion of the compressor wheel may limit the proximity of the electrode 17 to the compressor wheel 7.

With each of the embodiments described above, the rotational speed of the compressor wheel (i.e. turbocharger) may be determined simply by dividing the modulation frequency by the number of blades on the compressor wheel 7. This calculation may be performed within the frequency counter 34 or for instance by an ECU or other controller (such as for instance an actuator of a turbocharger wastegate or variable geometry inlet mechanism). The output from the frequency counter 34 may for example be in CAN (Controller Area Network) format, as will be appreciated by those skilled in the art. Providing the ECU with information on the turbocharger speed may for instance allow the ECU to optimise critical operational parameters of the engine to which the turbocharger is attached and also allow remedial action to prevent any possible damage to the turbocharger and/or engine in the event of the turbocharger over speeding.

Since known capacitive sensors rely on the modulation of the coupling between the electrode and the compressor wheel to produce a change in capacitance, they will not function if the compressor wheel is made of an electrically non-conducting material. This is because, without a conducting compressor wheel, there is no modulation of the capacitance of the sensing circuit related to the rotation of the turbomachine. On the contrary, as mentioned above, it has been shown that the sensor of the proposed invention will operate with an electrically non-conducting compressor wheel, for example, one made of a plastics material. This is because a plastics compressor wheel will still produce a detectable perturbation in the electric field.

Another problem the current invention overcomes is that of an unstable ground potential. One side of the power supply 42 is connected to a common ground, such as for instance the turbocharger housing, the engine block to which the turbocharger is attached and the bodywork/chassis of the vehicle of which the turbocharger forms part. As such, the ground potential of the turbocharger housing must be conducted to the compressor wheel 7. However, the compressor wheel 7 is typically supported, via the shaft 8 on oil fed journal bearings 9. Thus at least one oil film exists between the compressor wheel 7 and the ground potential. As the shaft 8 rotates, the thickness of the at least one film may alter, which in combination with the resistively of the oil changing due to soot content, may lead to an unstable difference between the ground potential of the turbocharger housing and that of the compressor wheel 7. An unstable ground potential may lead to erroneous signals at the electrode 17. The guard amplifier 33 substantially eliminates the adverse effects of unstable ground potential, as changes in potential between amplifier ground and the compressor wheel 7 are nullified by applying feedback in order to maintain a constant voltage at the amplifier 33.

It will be appreciated that many modifications can be made to the detail of the embodiments of the invention described above. For instance, the guard tube 18 of the first embodiment can be omitted if the shielding is provided by the compressor housing 6. However, in other embodiments of the invention, the housing 6 may not be made of a suitably conductive material in which case the guard tube 18 will be useful. Similarly, whereas the second embodiment described above has no dedicated electric field shield, as this is provided by the compressor housing, such a shield (similar to the guard tube 18) could be added if necessary.

In the second embodiment of the invention described above the electrode 17 may be such that its axial portion 17a is order of 100 mm in length. The surface area of the electrode 17 in either of the above embodiments may typically be between 1 mm$^2$ and 50 mm$^2$. In other embodiments the size of the electrode may vary. For instance, the electrode 17 may be ribbon shaped or may have an axial portion 17a comprising an enlarged spade portion (for instance it may end in a 'T' shape). Additionally the enlargement may be in two dimensions to form a base (e.g. with a drawing pin or thumbtack shape) which may be shaped substantially as a rectangle or trapezoid, or to match a portion of the surface swept by the compressor wheel blades (or the rotationally symmetric member). e.g. as an elongated trapezoid being curved in both its axes.

Although the electrode 17 may be of any appropriate size or shape, it is preferable that the angular extent of the electrode 17 with respect to the axis of rotation of the compressor wheel is less than half the angular separation between adjacent blades on the compressor wheel. This minimises time averaging of the perturbation of the electric field caused by the rotation of the compressor wheel and hence reduces smoothing of the signal.

For instance, it will be appreciated that the physical structure of the electrode 17 can vary. A simple conductive wire will be sufficient in many applications, in others a different configuration might be advantageous to establish the required electric field. In applications where the electrode 17 might be exposed to contamination it is preferable that the electrode surface is not exposed, as with the embodiments described above, unless the electrode is constructed of material which is not chemically reactive in particular environment. It is however useful to have the electrode separated from the fluid (e.g. gas) flow by a material which has a high dielectric constant. Similarly the configuration and construction of the sensor casing 23 may vary dependant upon the application and manner in which the sensor is to be supported and connected.

Although within the second embodiment of the invention described above, the electrode 17 is embedded within a noise baffle 35, it will be appreciated that the sensor may be embedded within any appropriate insert which is shaped so as to be received by the inlet 14.

The location of the sensor may also vary from that illustrated. It is advantageous to locate the electrode in close proximity to the compressor wheel (or other rotating component being monitored) where the perturbation of the electric field is greatest. It may also be preferably that the electrode is not located so as to have any significant adverse effect on efficient gas flow through the compressor. However, the electrode may be located in any position at which there is sufficient perturbation of the electric field for accurate detection. This may be either upstream or downstream of the compressor wheel with respect to the direction of gas flow and the electrode could for instance be located in either the inlet 14 or outlet 15. This could for instance be determined by simple testing in any particular application of the invention. In addition, the sensor circuit 29 could be located remote from the electrode 19.

In the above-described embodiments, the sensor circuit 29 is situated on the PCB 22. This need not be the case. The sensor circuit comprises a fixed voltage source 31, a current detection circuit 32, an amplifier 33 and a frequency counter 34. The frequency counter may comprise a frequency divider. Any of these circuit components may be located remotely to the PCB 22 and/or sensor assembly 16. For instance, the fixed voltage source 31 and frequency counter 34 may form part of an ECU or other controller, whereas the current detection circuit 32 and amplifier may be located on the PCB 22. Of course, electrical connections will always be required between the electrode 17 and respective components of the detection circuit 32. In another perceived embodiment, the frequency divider may be located on the PCB 22, its output being provided to a remote frequency counter which is connected to an ECU or other controller.

As such the sensor components may be split into two or more groups one of which may be physically positioned proximal to the electrode, and one of which may be physically positioned remotely such as adjacent to or within an ECU. It is however preferable that the amplifier is close to the electrode to minimise the likelihood of electrical interference. If the amplifier is located remotely from the electrode the connection between the two is preferably electrically shielded.

Alternative embodiments of sensor circuit adapted to measure the modulated current flow to the electrode could be readily devised by the appropriately skilled person. The voltage applied between the electrode and the compressor wheel (or other rotating member) may be determined as necessary to establish an electric field which exhibits a measurable perturbation. In some applications a voltage greater than about 30V will be appropriate, but for many applications the voltage is preferably greater than 50V, and more preferably greater than 70V. Voltages of over 120V may be used as this is readily accommodated by readily available electronic components. Much higher voltages, e.g. above 500V or above 1 kV, may well be advantageous in some applications. However, the use of such high voltages may necessitate the use of more robust circuitry components. The voltage at the electrode may be positive or negative in relation to compressor wheel (or other rotating member) so that the electrode is either an anode or a cathode with respect to the compressor wheel or other rotating member (which may be electrically conductive or non-conductive).

According to one embodiment the sensor circuit may comprise just one high gain amplifier, although for some applications this may require an expensive high quality amplifier. According to another embodiment there are two amplifiers, one being a guard (or shield) amplifier. The latter case offers the opportunity to use cheaper, and lower quality components. Although the guard amplifier may operate at any appropriate gain, it is preferable that it operates with a gain of substantially 1, so as to hold the outer shield layer of the screened cable and external electric field screen at the same potential.

In the above described embodiments of the invention, the electrode is mounted to the compressor housing to measure rotational speed of the compressor wheel. In other embodiments the electrode could be arranged to directly measure rotation of the turbine wheel or of some other feature of the turbocharger shaft. As such the sensor could be mounted to the turbine or bearing housings.

It will be appreciated that the invention is not limited in application to turbochargers but can be used to measure the rotational speed of other rotating machines. Examples of such rotating machines include, but are not limited to, a gas or liquid turbine (including for instance a power turbine or gas turbine or other form of engine), or a gas/liquid compressor which is not part of a turbocharger, or for instance a fluid pump. In such alternate applications the apparatus housing and/or the rotating member being monitored may be non-conductive, such as for instance a plastics impeller wheel rotating in a plastics housing.

It will also be appreciated that the choice of material of which the sensor casing, apparatus housing or rotating member is made may be such as to increase the perturbation of the electric field. This may depend on a property of the material, such as its place within the triboelectric series.

Furthermore, it will be appreciated that if the invention is to be applied to a rotating machine that does not comprise a rotationally salient member, then a rotationally salient member must be mechanically linked thereto. For instance, the speed of a shaft, or other rotating body which has no rotationally salient feature, may be measured by mechanically linking a member with a rotationally salient feature to the shaft (or other rotating body) such that they co-rotate. Accordingly, a sensor according to the present invention may detect the rotation of the co-rotating member and hence determine the speed of rotation of the shaft (or other rotating body).

As described above the invention measures perturbation in the electric field established between the electrode and the rotating member (e.g. compressor wheel). Without wishing to be bound by theory, it is believed that the perturbation may result from several effects discussed below.

FIG. 10a schematically illustrates an example of an electrode 72 embedded in a body 73 in proximity to a rotating member, in this illustration an electrically conductive compressor wheel 74. The body 73 may be fabricated from a non-conductive material (which may for instance be ceramic or a plastics member such as the baffle insert 35 described above or sensor casing 23) in which case it may electrically (and thermally) insulate the electrode 72 from a supporting housing or other support structure. Alternatively the body 73 could be fabricated from a conductive material, and if necessary electrically insulated from a surround housing or support structure (unless the support is itself non-conductive). In the latter case the body would preferably comprise a conductive material which is unreactive in the environment to which it is exposed (e.g. platinum). The body could also be omitted entirely, in which case it would be preferably for the electrode to be non-reactive.

Application of a voltage as described above establishes an electric field between the electrode 72 and a constant potential portion, which in this case is the wheel 74. Both the body 73 and the gas 75 (i.e. air) flowing between the wheel 74 and the body 73 behave as dielectric materials with different dielectric properties. The electric field extends a total distance A between the electrode 72 and the wheel 74. Of the total distance A, a portion B of that distance is through gas 75 (air in this case) between the wheel 74 and the body 73. The electric field extends a portion C of the distance A through the body 73.

FIG. 10*b* schematically illustrates another example of an electrode 72 embedded in a body 73 in proximity to a rotating member, in this illustration an electrically non-conductive compressor wheel 74*a*, which is rotatably mounted on electrically conductive shaft 8. Application of a voltage as described above, between the electrode 72 and shaft 8, establishes an electric field between the electrode 72 and a constant potential portion, which in this case is the shaft 8. The body 73, the gas 75 (i.e. air flowing between the wheel 74*a* and the body 73) and the non-conductive compressor wheel 74*a* all behave as dielectric materials with different dielectric properties. The electric field extends a total distance A between the electrode 72 and the shaft 8. Of the total distance A, a portion B of that distance is through gas 75 (air in this case) between the wheel 74 and the body 73. The electric field extends a portion C of the distance A through the body 73. The electric field extends a portion D through the compressor wheel.

FIG. 10*c* schematically illustrates a further example of an electrode 72 embedded in a body 73 in proximity to a rotating member, in this illustration an electrically non-conductive compressor wheel 74*b*. Application of a voltage to the electrode 72 as described above, establishes an electric field between the electrode 72 and a constant potential portion of the compressor 78, which could for instance be a portion of the compressor housing (electrically isolated if necessary) or a dedicated electrode supported by the housing. The body 73, the gas 75 (i.e. air flowing between the wheel 74, the body 73 and the constant potential portion 78) and the non-conductive compressor wheel 74*b* all behave as dielectric materials with different dielectric properties. The electric field extends a total distance A between the electrode 72 and the constant potential portion 78. Of the total distance A, portions B and E of that is through gas 75 (air in this case) between the wheel 74, the body 73 and the constant potential portion 78. The electric field extends a portion C of the distance A through the body 73. The electric field extends a portion D through the compressor wheel.

Ions may be present in the region of the electric field (the term "ions" used to refer to any charged entity which is affected by the electric field and for the avoidance of doubt includes charged molecules. Depending on whether or not the electrode is held at a higher or lower potential than the wheel, one will constitute an anode and the other a cathode. Negatively charged ions will be attracted toward the anode and positively charged ions will be attracted toward the cathode. Free or mobile ions experiencing this force will move towards either the electrode 72 or compressor wheel 74. The mobile ions may contact the electrode 17 or compressor wheel 74 and directly transfer charge thereto and/or their redistribution may cause a perturbation of the electric field within the dielectric materials. It is thought that a perturbation in the electric field will occur, in particular, where a bulk redistribution of ions occurs such that ions of a particular polarity are localised in a particular region of the field.

Mobile ions may be present in both the gas 75 and body 73 depending on their composition. As the compressor wheel 74 rotates, frictional forces between it and the gas 75 may cause the surface of the wheel 74 to lose or gain charge, and hence create ions. Frictional forces between the gas 75 and body 73 (and any other surface in the gas flow) may cause the exposed surface of the body 73 (or other surface) to lose or gain charge, again creating ions. In both of these cases it is likely that, not only will ions be created in the exposed surfaces, but also that complementary ions will be created in the gas 75. Furthermore, turbulence within the gas 75 itself may also result in ion creation. One possible mechanism for the creation of ions is electron displacement.

If the ions are created in a conductive material, such as metal, then the ion charge is free to move (also known as current flow) within the conductive material under the influence of the containment field. If the ions are created in an insulator material the ion charge is not free to move, and as such, the charge accumulates at the surface of the material where the ions are created. In the case where ions are created in the gas 75, the ions constitute localised charge. In the gas 75 it is the ions themselves which are free to move, as opposed to the ion charge in a conductive material.

The illustrated compressor wheel 74 comprises a central main body 76, around which a plurality of radially, outwardly extending blades 77 are equi-angularly spaced. As the compressor wheel rotates, the turbulence of the gas 75 is more pronounced around the edges of the blades 77. As such, creation of ions is promoted when the edges of the blades 77 are proximate the electrode 72. This is due not only to the fact that the turbulence of the gas 75 (and hence any frictional forces leading to ion creation) may be greater in the region near to the electrode 72, but also that any electric force on a charged particle, due to the electric field (such as that on an electron which may be stripped off an entity to produce an ion), is greater the closer the charged particle is to the electrode 72. If for example the compressor wheel 74 is a conductor, for instance metal, then charge will also naturally accumulate around the sharp edges of each blade 77 even when the wheel is stationary.

The sensor circuitry attached to the electrode 72 not only comprises a voltage source, which operates to supply or receive charge to and from the electrode 72, so that a current flows between the voltage source and the electrode which is detected. The movement of charge within the electric field, both on to the electrode 72 or compressor wheel 74, or so as to cause a bulk redistribution and localisation of charge, results in a perturbation of the electric field within the dielectric materials.

Due to the fact that the sensor circuitry connected to the electrode 72 is capable of supplying current, the perturbation of the electric field causes the circuitry to try to maintain the overall charge potential of the system and hence counteract the modification of the dielectric field. To do this, a compensating current flows through the electrode 72, to maintain the voltage V at the electrode.

As the compressor wheel 74 rotates, blades 77 repeatedly pass the electrode 72. Due to the fact that, as explained above, creation of ions is promoted when the edges of the blades 77 are proximate the electrode 72, rotation of the compressor wheel 74 causes modulated perturbation of the electric field (which may be referred to as charge modulation). As such, the current which flows through the electrode 72 is also modulated by the rotation of the compressor wheel 74 at a frequency corresponding the rotational speed of the wheel. The modulated current may be amplified and fed to a frequency counter so as to determine the frequency of the modulation and hence the rotational speed of the wheel 74.

It is thought that the perturbation of the electric field may also be considered as resulting from, at least in part, alteration in at least one of the dielectric properties of the materials within the electric field, in this case the gas 75 and body 73. An example of such a dielectric property is its dielectric constant. The dielectric constant may be altered by, for instance, a change in temperature or pressure of the materials. This differs from known capacitive type sensors, in that they are understood to function so as to detect a change in capacitance in the sensor resulting from a change in distance between the electrode and the blades, whereas the sensor according to the invention utilises the change in charge distribution within or at the surface of the dielectric and a corresponding perturbation of the electric field.

As previously discussed, the electric field is thought to not only promote the creation of ions, by allowing electrons to overcome the localised potentials of their parent atoms or molecules, but in addition it creates a potential within which both free ions and free charge move (e.g. negatively charged ions or electrons towards an anode etc). In this regard the electric field may be regarded as a containment field. Furthermore, the electric field helps to overcome the problem of input saturation which occurs in known sensor electronics of a type similar to that of the proposed invention.

In the absence of the electric field, any ions present within the turbine wheel 74, gas 75 and body 73 are free to drift in a random manner, due to, for example, thermal motion. As the ions drift, they may collide with other bodies, such as uncharged atoms and molecules. For this reason in the absence of an electric field, the generated charged ions would be substantially free to drift, resulting in drift of the electric field and hence an unstable potential at the electrode. The potential at the electrode may drift to such an extent that it exceeds the magnitude of any signal resulting from the movement of the turbine wheel 74. As such, said signal would be masked and/or distorted by the drift potential. In extreme cases, for example, if charged particles were injected into the electric field, the drift voltage may also exceed the allowable input voltage of the sensing electronics. This is known as input saturation. Input saturation occurs when the charge accumulated on the electrode 72 results in a potential, the magnitude of which is outside the input range of an amplifier which forms part of said measuring means. By establishing the electric field this may be prevented so that modulation of the electrode potential which occurs as a result of charge modulation within the electric field is detectable as the amplifier will not be overwhelmed by the input saturation potential. The electric filed prevents a high potential developing on the electrode due to drift which may otherwise be large enough to damage components in the sensing circuit.

The use of an electric field fed by a voltage supply, which might typically be in the range of 50V to 1 kV, means that the movement of any ion is governed mainly by the electric field and not by thermal motion. As such, the amount of drift of the ions and hence in the dielectric field is greatly reduced. As a result, any electrode potential noise is reduced, thereby increasing the signal to noise ratio. In addition, the electric field, in minimising ion drift, substantially prevents input saturation, thereby avoiding the need to bias the electrode 72, which would attenuate the signal.

The use of a voltage supply is also thought to enhance the amplitude of the charge modulation. This may result from the voltage supply increasing the movement of mobile electrons across the electric field. This action may be directed to compensate or react to changes in the charge distribution caused by mechanical action of a rotationally salient rotating member. In this way, a virtual charge balance potential may be achieved mid-way between the containment potential.

The axial profile of the electrode 72 may be shaped such that it corresponds to the axial profile of the blades 77 when they are proximate the electrode 72. As the majority of charge generation is thought to occur at the edges of the blade 77. If the edges of the blade 77 are the same shape as the electrode 72 this may increase the coupling between the two, so that the charge transfer between the blades 77 and the electrode 72 is maximised.

It is thought that the perturbation of the electric field may comprise changes in the electric field as for instance schematically illustrated in FIGS. 11a and 11b. FIG. 11a shows equipotential field lines around an electrode 79 held at a raised voltage by a constant voltage source adjacent a non-conductive dielectric rotationally salient rotating member 80. FIG. 11b illustrates a dielectric salient feature 81 of the rotating member passing into a portion of the field extending between the electrode 79 and the rotating member 80 thereby condensing the equipotential lines and increasing the electric field gradient in the vicinity of the electrode. The increased gradient is equivalent to a situation where charge is brought near to the electrode causing current to flow therein.

The dielectric member 81 allows charges to build up in the direction of the electrode 79. The molecules polarize within the dielectric in response to the field gradient and serve to counteract it. In a dielectric with a dielectric constant higher than 1 (such as typical plastics which are in the range 1.5 to 4) the equipotential lines are separated within the material, and thus are necessarily closer together immediately outside of the material.

The raised sensor voltage relative to a relevant ground permits the described effect to be detected, and this system of measurement offers improved signal to noise ratios. It has been discovered that voltages well in excess of the typical voltages used in typical electronics circuitry (i.e. 5V or 12V) causes effects in the movement of charge which are consistent with each revolution, whereas lower voltages allow the sensor potential to fluctuate in response to contaminants in a proximate fluid flow, or any variation in potential of any relevant proximal ground due to poor electrical connections (such as due to a shaft or wheel being connected to earth through an oil film bearing).

The invention claimed is:

1. A speed sensor for use in measuring the speed of rotation of a rotationally salient rotating member, the speed sensor comprising an electrode and a sensor circuit;

the sensor circuit comprising:
a voltage source for supplying a voltage to the electrode to generate an electric field in a dielectric medium between, the electrode and the rotating member;
a current detector for detecting current flow between the voltage source and the electrode due to perturbation of the electric field by passage of at least one salient feature of the rotating member through the electric field as the rotating member rotates, the current detector outputting a first signal modulated at a frequency corresponding to the frequency of perturbation of the electric field; and
an amplifier circuit comprising a signal amplifier for amplifying the first signal and outputting a second signal modulated at a frequency corresponding to the frequency of perturbation of the electric field,
wherein the first signal is a modulated voltage, and wherein the current detector comprises a capacitor and a resistor connected in series across the voltage source, wherein the electrode is connected to a node between the voltage source and a first terminal of the capacitor, and the first output signal is taken from a node between a second terminal of the capacitor and the resistor.

2. A speed sensor according to claim 1, wherein said voltage source supplies a voltage in the range of +/−30V to +/−500V.

3. A speed sensor according to claim 1, comprising a feed back loop connected across the amplifier circuit and including a first capacitor.

4. A speed sensor according to claim 1, wherein the electrode has a surface from which the electric field extends, at least a portion of that surface which in use is closest to the rotating member being covered by body of protective material.

5. A speed sensor according to claim 4, wherein said protective material is non-conductive.

6. A speed sensor according to claim 1, wherein the electrode comprises an electrode body and an electrode surface from which the electric field extends, at least a portion of that surface which in use is closest to the rotating member being defined by a conductive material different from the body of the electrode.

7. A speed sensor according to claim 1, wherein the voltage source is a constant voltage source.

8. A speed sensor for use in measuring the speed of rotation of a rotationally salient rotating member, the speed sensor comprising an electrode and a sensor circuit;
the sensor circuit comprising:
a voltage source for supplying a voltage to the electrode to generate an electric field in a dielectric medium between, the electrode and the rotating member;
a current detector for detecting current flow between the voltage source and the electrode due to perturbation of the electric field by passage of at least one salient feature of the rotating member through the electric field as the rotating member rotates, the current detector outputting a first signal modulated at a frequency corresponding to the frequency of perturbation of the electric field; and
an amplifier circuit comprising a signal amplifier for amplifying the first signal and outputting a second signal modulated at a frequency corresponding to the frequency of perturbation of the electric field; and
at least one conductive shield electrically shielding at least a portion of the speed sensor;
wherein said amplifier circuit includes a shield amplifier the output of which drives the at least one conductive shield.

9. A speed sensor according to claim 8, wherein the at least one conductive shield is held at a controlled electric potential.

10. A speed sensor according to claim 8, wherein the at least one conductive shield comprises at least two conductive shields shielding portions of the sensor circuit.

11. A speed sensor according to claim 10, wherein the shield amplifier holds each conductive shield at the same electric potential.

12. A speed sensor according to claim 8, wherein the shield amplifier has substantially unity gain.

13. A speed sensor according to claim 8, wherein the shield amplifier is coupled to the signal amplifier.

14. A speed sensor according to claim 13, wherein the shield amplifier is connected in series with the signal amplifier, and comprising a feed back loop connected across the signal amplifier and said shield amplifier, the feedback loop including a first capacitor.

15. A speed sensor according to claim 8, the portion of the speed sensor electrically shielded by the at least one conductive shield being a connection between the electrode and the sensor circuit, or a connection between elements of the sensor circuit.

16. A speed sensor for use in measuring the speed of rotation of a rotationally salient rotating member, the speed sensor comprising an electrode and a sensor circuit;
the sensor circuit comprising:
a voltage source for supplying a voltage to the electrode to generate an electric field in a dielectric medium between, the electrode and the rotating member;
a current detector for detecting current flow between the voltage source and the electrode due to perturbation of the electric field by passage of at least one salient feature of the rotating member through the electric field as the rotating member rotates, the current detector outputting a first signal modulated at a frequency corresponding to the frequency of perturbation of the electric field;
an amplifier circuit comprising a signal amplifier for amplifying the first signal and outputting a second signal modulated at a frequency corresponding to the frequency of perturbation of the electric field; and
a feed back loop connected across the amplifier circuit and including a first capacitor,
wherein the first capacitor is part of a capacitive divider.

17. A speed sensor according to claim 16, wherein the capacitive divider comprises said first capacitor and a potential divider.

* * * * *